US012419141B2

(12) United States Patent
Fukumori

(10) Patent No.: US 12,419,141 B2
(45) Date of Patent: Sep. 16, 2025

(54) LIGHT-EMITTING ELEMENT

(71) Applicant: NICHIA CORPORATION, Anan (JP)

(72) Inventor: Takanori Fukumori, Tokushima (JP)

(73) Assignee: NICHIA CORPORATION, Anan (JP)

( * ) Notice: Subject to any disclaimer, the term of this patent is extended or adjusted under 35 U.S.C. 154(b) by 478 days.

(21) Appl. No.: 18/064,485

(22) Filed: Dec. 12, 2022

(65) Prior Publication Data
US 2023/0197887 A1    Jun. 22, 2023

(30) Foreign Application Priority Data
Dec. 20, 2021   (JP) .................. 2021-206192

(51) Int. Cl.
H10H 20/81    (2025.01)
H10H 20/01    (2025.01)
H10H 20/812   (2025.01)

(52) U.S. Cl.
CPC .... H10H 20/8215 (2025.01); H10H 20/0137 (2025.01); H10H 20/812 (2025.01); *H10H 20/81* (2025.01)

(58) Field of Classification Search
CPC ................................................... H10H 20/813
See application file for complete search history.

(56) References Cited

U.S. PATENT DOCUMENTS 5,777,350 A    7/1998  Nakamura et al.
5,959,307 A    9/1999  Nakamura et al.
2001/0030318 A1  10/2001 Nakamura et al.
2002/0167019 A1  11/2002 Nakamura et al.
2003/0116767 A1   6/2003 Kneissl et al.
2004/0066816 A1   4/2004 Collins et al.
2008/0116477 A1   5/2008 Komada
2008/0118999 A1   5/2008 Komada
(Continued)

FOREIGN PATENT DOCUMENTS

JP    H09-036430 A   2/1997
JP    H09-148678 A   6/1997
(Continued)

OTHER PUBLICATIONS

J. Piprek "Origin of InGaN/GaN light-emitting diode efficiency improvements using tunnel-junction-cascaded active regions", Applied Physics Letters, vol. 104, p. 051118.

*Primary Examiner* — Ajay Ojha
*Assistant Examiner* — Hajar Kolahdouzan
(74) *Attorney, Agent, or Firm* — Foley & Lardner LLP

(57) ABSTRACT

A light-emitting element includes, successively from a lower side to an upper side, a first n-side semiconductor layer, a first active layer, a first p-side semiconductor layer, a second n-side semiconductor layer, a second active layer, and a second p-side semiconductor layer, each made of a nitride semiconductor. The second n-side semiconductor layer contacts the first p-side semiconductor layer. The second n-side semiconductor layer includes, successively from a lower side to an upper side, a first layer including gallium, a second layer including aluminum and gallium, and a third layer including gallium and having a lower n-type impurity concentration than the first and second layers. A thickness of the first layer and a thickness of the second layer each is less than 50% of a thickness of the third layer.

22 Claims, 8 Drawing Sheets

(56) References Cited

U.S. PATENT DOCUMENTS

| | | |
|---|---|---|
| 2008/0217646 A1 | 9/2008 | Komada |
| 2013/0270514 A1* | 10/2013 | Saxler ................. H10H 20/813 |
| | | 257/E29.105 |
| 2021/0305451 A1 | 9/2021 | Kishino |

FOREIGN PATENT DOCUMENTS

| | | |
|---|---|---|
| JP | 2004-128502 A | 4/2004 |
| JP | 2008-130877 A | 6/2008 |
| JP | 2008-130878 A | 6/2008 |
| JP | 2008-141047 A | 6/2008 |
| JP | 2008-226906 A | 9/2008 |
| JP | 2010-251804 A | 11/2010 |
| JP | 2011-040784 A | 2/2011 |
| JP | 2021-158291 A | 10/2021 |
| WO | WO-2020/206003 A1 | 10/2020 |

* cited by examiner

LIGHT-EMITTING ELEMENT

CROSS-REFERENCE TO RELATED APPLICATIONS

This application is based upon and claims priority to Japanese Patent Application No. 2021-206192, filed on Dec. 20, 2021, the entire contents of which are incorporated herein by reference.

FIELD

Embodiments relate to a light-emitting element.

BACKGROUND

For example, JP-A 2004-128502 describes a light-emitting element including a first light-emitting part that includes a first n-type layer, a first active layer, and a first p-type layer, a tunnel junction layer located on the first light-emitting part, and a second light-emitting part that is located on the tunnel junction layer and includes a second n-type layer, a second active layer, and a second p-type layer.

SUMMARY

According to one aspect of the present invention, a light-emitting element includes a first n-side semiconductor layer, a first active layer, a first p-side semiconductor layer, a second n-side semiconductor layer, a second active layer, and a second p-side semiconductor layer made of nitride semiconductors successively from a lower side to an upper side. The second n-side semiconductor layer contacts the first p-side semiconductor layer. The second n-side semiconductor layer includes, successively from a lower side to an upper side, a first layer including gallium, a second layer including aluminum and gallium, and a third layer including gallium and having a lower n-type impurity concentration than the first and second layers. A thickness of the first layer and a thickness of the second layer each is less than 50% of a thickness of the third layer.

DETAILED DESCRIPTION

Figure 1:
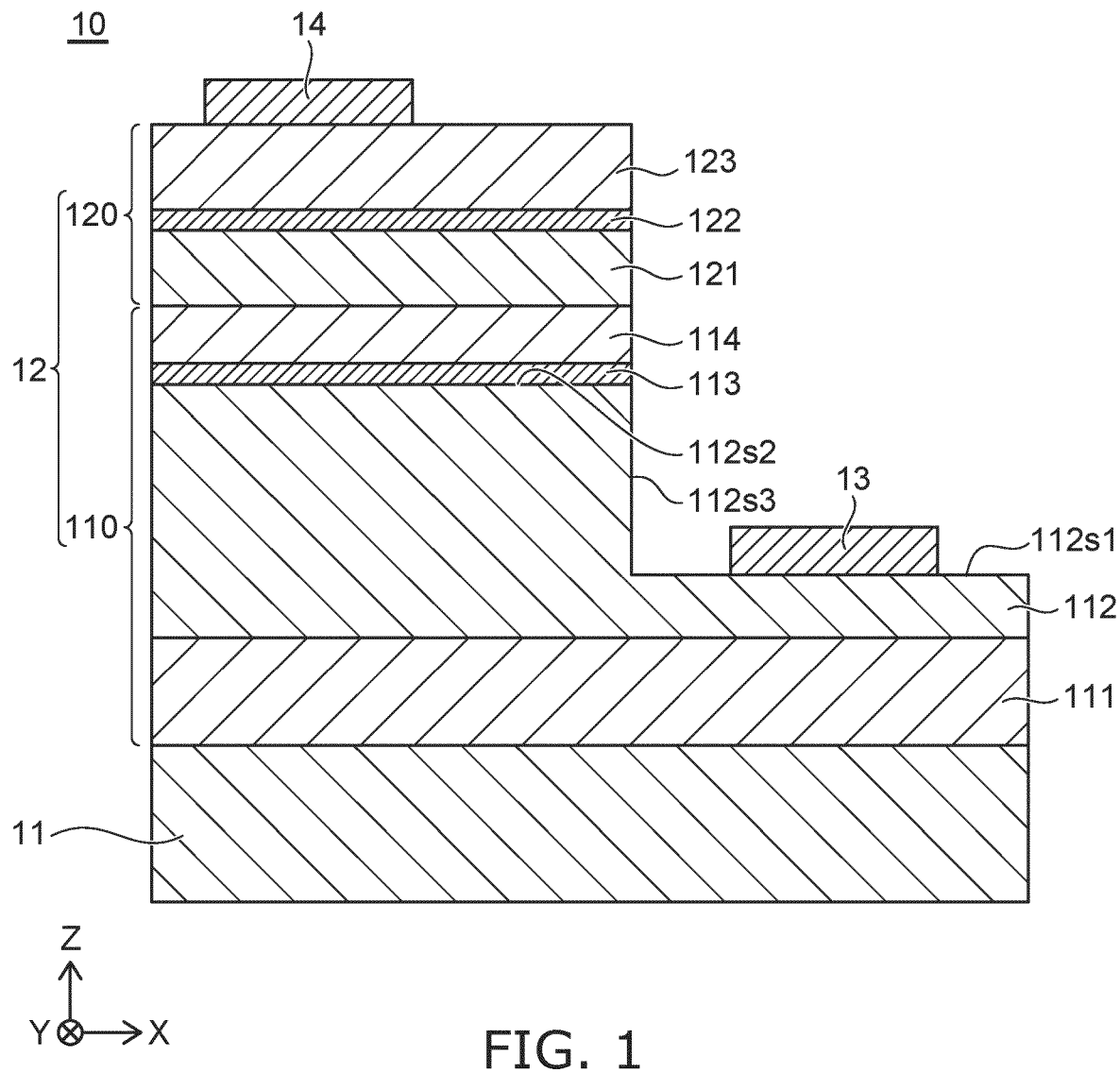
FIG. 1 is a cross-sectional view showing a light-emitting element 10 according to an embodiment.

Exemplary embodiments will now be described with reference to the drawings. The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions. In the specification of the application and the drawings, components similar to those described in regard to a drawing therein above are marked with like reference numerals, and a detailed description is omitted as appropriate.

For easier understanding of the following description, the arrangements and configurations of the portions are described using an XYZ orthogonal coordinate system. The X-axis, the Y-axis, and the Z-axis are orthogonal to each other. The direction in which the X-axis extends is taken as an "X-direction," the direction in which the Y-axis extends is taken as a "Y-direction," and the direction in which the Z-axis extends is taken as a "Z-direction." Although up is taken as the Z-direction and down is taken as the opposite direction for easier understanding of the description, these directions are relative and are independent of the direction of gravity.

FIG. 1 is a cross-sectional view showing a light-emitting element 10 according to the embodiment.

Figure 2:
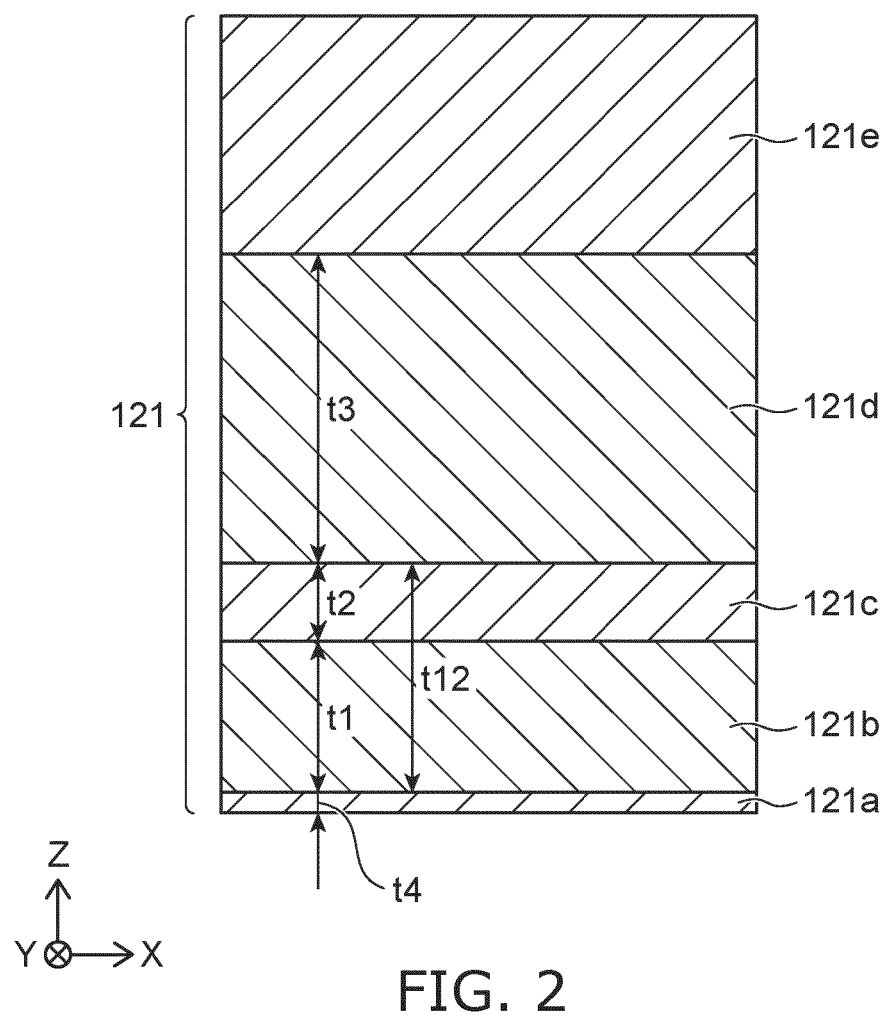
FIG. 2 is an enlarged cross-sectional view showing a second n-side semiconductor layer 121 of FIG. 1.

FIG. 2 is an enlarged cross-sectional view showing a second n-side semiconductor layer 121 of FIG. 1.

Figure 3:
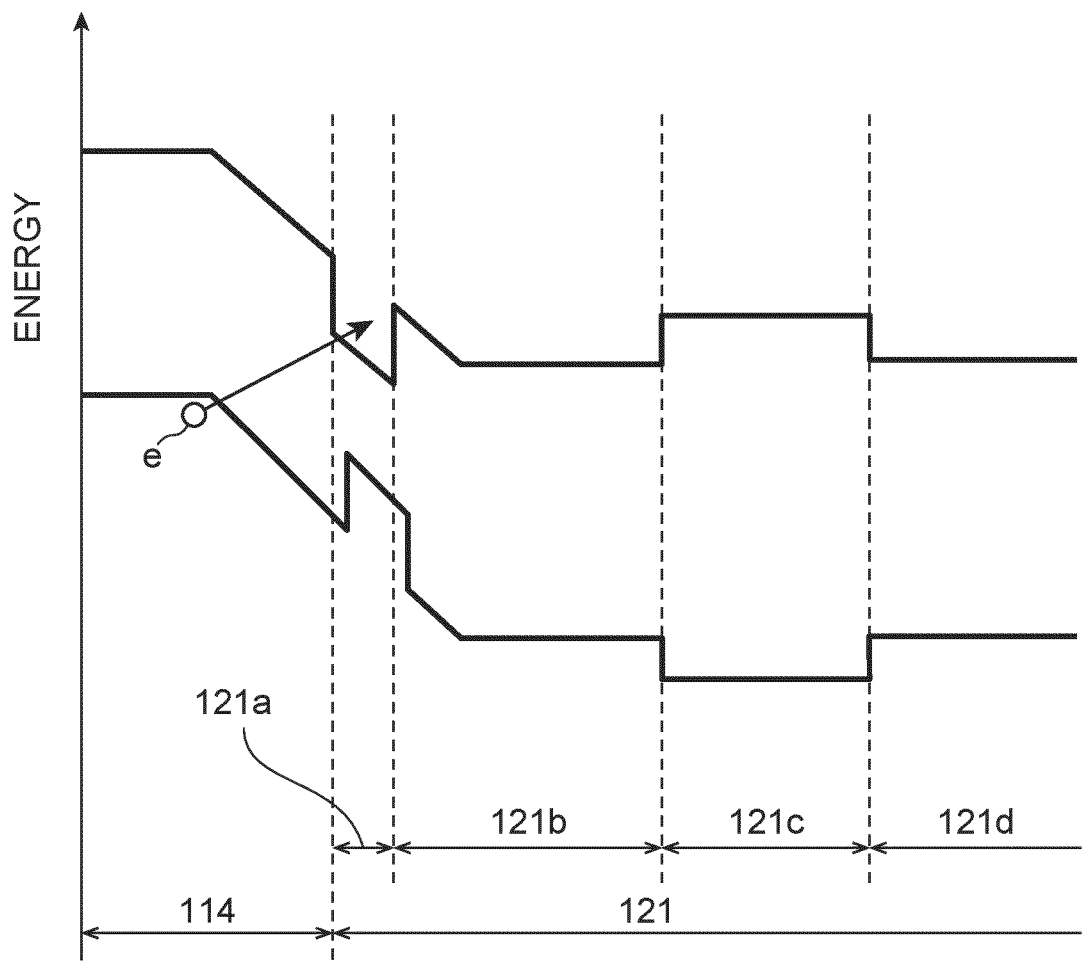
FIG. 3 is an example of an energy band diagram of the light-emitting element 10 according to the embodiment.

FIG. 3 is an example of an energy band diagram of the light-emitting element 10 according to the embodiment.

As shown in FIG. 1, the light-emitting element 10 includes a substrate 11, a semiconductor structure body 12, an n-side electrode 13, and a p-side electrode 14.

The substrate 11 has a flat plate shape. For example, the upper surface and the lower surface of the substrate 11 are substantially parallel to the X-Y plane. For example, the substrate 11 is made of sapphire ($Al_2O_3$). However, the substrate 11 may include another material, such as silicon (Si), silicon carbide (SiC), gallium nitride (GaN), etc. The semiconductor structure body 12 is located on the substrate 11.

The semiconductor structure body 12 is, for example, a stacked body in which multiple semiconductor layers made of nitride semiconductors are stacked. In this specification, a "nitride semiconductor" is a semiconductor that includes nitrogen, and typically includes all compositions of semiconductors of the chemical formula $In_xAl_yGa_{1-x-y}N$ ($0 \le x \le 1$, $0 \le y \le 1$, and $x+y \le 1$) for which the composition ratios x and y are changed within the ranges respectively.

The semiconductor structure body 12 includes a first light-emitting part 110 and a second light-emitting part 120 successively from a lower side to an upper side. The first light-emitting part 110 includes a first n-side semiconductor layer 112, a first active layer 113, and a first p-side semiconductor layer 114 successively from a lower side to an upper side. The first light-emitting part 110 further includes a foundation layer 111 located under the first n-side semiconductor layer 112. The second light-emitting part 120 includes the second n-side semiconductor layer 121, a second active layer 122, and a second p-side semiconductor layer 123 successively from a lower side to an upper side. The components of the semiconductor structure body 12 will now be elaborated.

The foundation layer 111 of the first light-emitting part 110 is located on the substrate 11. The foundation layer 111 includes, for example, an undoped semiconductor layer. In the specification, "undoped" means that neither an n-type impurity nor a p-type impurity is intentionally doped. In other words, an undoped semiconductor layer is a semiconductor layer formed without supplying a raw material gas including an n-type impurity and/or a p-type impurity. The term "n-type impurity" means an impurity that forms donors. The term "p-type impurity" means an impurity that forms acceptors. There are cases in which an undoped semiconductor layer that is adjacent to a layer intentionally doped with an n-type impurity and/or a p-type impurity includes the n-type impurity and/or the p-type impurity due to diffusion into the undoped semiconductor layer from the adjacent layer, etc.

The undoped semiconductor layer of the foundation layer 111 includes, for example, GaN. The first n-side semiconductor layer 112 is located on the foundation layer 111. However, the first n-side semiconductor layer may be directly located on the substrate without including the foundation layer in the first light-emitting part.

The first n-side semiconductor layer 112 includes one or more n-type semiconductor layers. The n-type semiconductor layer of the first n-side semiconductor layer 112 includes, for example, GaN doped with silicon (Si) as the n-type impurity. The n-type semiconductor layer of the first n-side semiconductor layer 112 may further include indium (In), aluminum (Al), etc. The n-type semiconductor layer of the first n-side semiconductor layer 112 may include germanium (Ge) as the n-type impurity.

It is sufficient for the first n-side semiconductor layer 112 to have a function of supplying electrons to the first active layer 113; and the first n-side semiconductor layer 112 may further include one or more undoped semiconductor layers. The undoped semiconductor layer of the first n-side semiconductor layer 112 includes, for example, GaN.

The first n-side semiconductor layer 112 includes a first surface 112s1, a second surface 112s2, and a third surface 112s3. The first surface 112s1 is substantially parallel to the X-Y plane. The second surface 112s2 is positioned higher than the first surface 112s1 and is substantially parallel to the X-Y plane. When viewed in top-view, the second surface 112s2 is next to the first surface 112s1 in the X-direction. The third surface 112s3 is positioned between the first surface 112s1 and the second surface 112s2 and is substantially parallel to the Y-Z plane. The first active layer 113 is located on the second surface 112s2.

The first active layer 113 has, for example, a multi-quantum well structure that includes multiple well layers and multiple barrier layers. The multiple well layers can include, for example, indium gallium nitride (InGaN). The multiple barrier layers can include, for example, GaN. The well layer and the barrier layer may be, for example, undoped semiconductor layers. At least portions of the well layer and the barrier layer may include an n-type impurity and/or a p-type impurity. The first p-side semiconductor layer 114 is located on the first active layer 113.

The first p-side semiconductor layer 114 includes, for example, one or more p-type semiconductor layers having a function of supplying holes to the first active layer 113. The p-type semiconductor layer of the first p-side semiconductor layer 114 includes, for example, GaN doped with magnesium (Mg) as the p-type impurity. The p-type semiconductor layer of the first p-side semiconductor layer 114 may further include Al.

The first p-side semiconductor layer 114 may further include one or more undoped semiconductor layers. The undoped semiconductor layer of the first p-side semiconductor layer 114 includes, for example, GaN. The undoped semiconductor layer of the first p-side semiconductor layer 114 may further include Al. The first p-side semiconductor layer 114 may further include a p-type upper semiconductor layer that has a tunnel junction with the second n-side semiconductor layer 121. The upper semiconductor layer includes, for example, GaN doped with Mg as the p-type impurity. For example, the p-type impurity concentration of the upper semiconductor layer is greater than the p-type impurity concentration of the p-type semiconductor layer positioned below the upper semiconductor layer in the first p-side semiconductor layer 114. The second n-side semiconductor layer 121 is located on the first p-side semiconductor layer 114.

The second n-side semiconductor layer 121 contacts the first p-side semiconductor layer 114. As shown in FIG. 2, the second n-side semiconductor layer 121 includes a first layer 121b, a second layer 121c, and a third layer 121d successively from a lower side to an upper side. According to the embodiment, the second n-side semiconductor layer 121 further includes a fourth layer 121a located between the first layer 121b and the first p-side semiconductor layer 114, and a fifth layer 121e located on the third layer 121d.

The fourth layer 121a is located at the first p-side semiconductor layer 114. The fourth layer 121a is, for example, a GaN layer doped with Si as the n-type impurity. The fourth layer 121a may further include In. In other words, the fourth layer 121a may be an InGaN layer doped with Si as the n-type impurity. When the fourth layer 121a is an InGaN layer, the value of the In composition ratio in the fourth layer 121a is, for example, favorably not less than 10% and not more than 40%, and more favorably not less than 20% and not more than 40%.

The first layer 121b is located on the fourth layer 121a. The first layer 121b includes Ga. The first layer 121b is, for example, a GaN layer doped with Si as the n-type impurity. The first layer 121b may further include In. In other words, the first layer 121b may be an InGaN layer doped with Si as the n-type impurity. When the first layer 121b is an InGaN layer, it is favorable for the value of the In composition ratio in the first layer 121b to be less than the value of the In composition ratio in the fourth layer 121a. In such a case, it is favorable for the value of the In composition ratio in the first layer 121b to be, for example, not less than 0.1% and not more than 3%.

The second layer 121c is located on the first layer 121b. The second layer 121c includes Al and Ga. According to the embodiment, the second layer 121c is an AlGaN layer doped with Si as the n-type impurity. As shown in FIG. 3, the bandgap of the second layer 121c is greater than the bandgap of the fourth layer 121a and the bandgap of the first layer 121b. The second layer 121c may be, for example, an aluminum indium gallium nitride (AlInGaN) layer. The value of the Al composition ratio in the second layer 121c is not less than 5% and not more than 35%.

As shown in FIG. 2, the third layer 121d is located on the second layer 121c. The third layer 121d includes Ga. The third layer 121d is, for example, a GaN layer doped with Si as the n-type impurity.

The fifth layer 121e is located on the third layer 121d. For example, the fifth layer 121e has a function of supplying electrons to the second active layer 122. The fifth layer 121e can be, for example, a superlattice layer in which a GaN layer and an InGaN layer are alternately arranged. At least a portion of the semiconductor layer of the fifth layer 121e may include an n-type impurity and/or a p-type impurity.

The n-type impurity concentrations of the fourth layer 121a, the first layer 121b, the second layer 121c, the third layer 121d, and the fifth layer 121e will now be described. Herein, the n-type impurity concentration of the fourth layer 121a is also called the "fourth n-type impurity concentration"; the n-type impurity concentration of the first layer 121b is also called the "first n-type impurity concentration"; the n-type impurity concentration of the second layer 121c is also called the "second n-type impurity concentration"; the n-type impurity concentration of the third layer 121d is also called the "third n-type impurity concentration"; the n-type impurity concentration of the fifth layer 121e is also called the "fifth n-type impurity concentration."

According to the embodiment, the magnitude relationship of the n-type impurity concentrations is fourth n-type impurity concentration>first n-type impurity concentration≥second n-type impurity concentration>third n-type impurity concentration. Also, second n-type impurity concentration>fifth n-type impurity concentration. However, the magnitude relationship of the n-type impurity concentrations is not limited to such a magnitude relationship. For example, the second n-type impurity concentration may be greater than the first n-type impurity concentration. Also, for example, the fifth n-type impurity concentration may be not less than the second n-type impurity concentration.

The fourth n-type impurity concentration is, for example, not less than $2 \times 10^{20}$ cm$^{-3}$ and not more than $1 \times 10^{21}$ cm$^{-3}$. The first n-type impurity concentration is, for example, not less than $4 \times 10^{19}$ cm$^{-3}$ and not more than $2 \times 10^{20}$ cm$^{-3}$. The second n-type impurity concentration is, for example, not less than $2 \times 10^{19}$ cm$^{-3}$ and not more than $2 \times 10^{20}$ cm$^{-3}$. The third n-type impurity concentration is, for example, not less than $1 \times 10^{18}$ cm$^{-3}$ and not more than $2 \times 10^{19}$ cm$^{-3}$. The fifth n-type impurity concentration is, for example, not less than $1 \times 10^{18}$ cm$^{-3}$ and not more than $4 \times 10^{19}$ cm$^{-3}$.

A thickness t4 of the fourth layer 121a, a thickness t1 of the first layer 121b, a thickness t2 of the second layer 121c, and a thickness t3 of the third layer 121d will now be described. Herein, "thickness" means the dimension of each layer in the vertical direction.

According to the embodiment, the magnitude relationship of the thicknesses of the layers is thickness t4<thickness t2<thickness t1<thickness t3. However, the magnitude relationship of the thicknesses is not limited to such a magnitude relationship. For example, the thickness t2 may be not less than the thickness t1.

The thickness t1 of the first layer 121b and the thickness t2 of the second layer 121c each are less than 50% of the thickness t3 of the third layer 121d. The thickness t2 of the second layer 121c is not more than 40% of a total thickness t12 of the first and second layers 121b and 121c. Here, total thickness t12=thickness t1+thickness t2. However, the thickness t2 may be greater than 40% of the total thickness t12.

The thickness t4 of the fourth layer 121a is, for example, not less than 0.1 nm and not more than 2 nm. The thickness t1 of the first layer 121b is, for example, not less than 10 nm and not more than 40 nm. The thickness t2 of the second layer 121c is, for example, not less than 10 nm and not more than 30 nm. The thickness t3 of the third layer 121d is, for example, not less than 80 nm and not more than 150 nm.

The functions of the fourth layer 121a, the first layer 121b, the second layer 121c, and the third layer 121d will now be described.

The fourth layer 121a that has a high n-type impurity concentration is located at the vicinity of the p-n junction portion formed by the first p-side semiconductor layer 114 and the second n-side semiconductor layer 121. The carrier density at the vicinity of the p-n junction portion can be increased thereby, which reduces the width of the depletion layer at the p-n junction portion and makes electron tunneling easier.

Because the fourth layer 121a is an InGaN layer having a relatively high value of the In composition ratio, the bandgap of the fourth layer 121a can be reduced. For example, as shown in FIG. 3, a portion of the conduction band has a low energy level at the vicinity of the p-n junction portion formed by the first p-side semiconductor layer 114 and the second n-side semiconductor layer 121. As a result, the tunnel effect easily occurs between the first p-side semiconductor layer 114 and the second n-side semiconductor layer 121. Although the details are described below, for example, the electrons e that exist in the valence band of the first p-side semiconductor layer 114 easily tunnel into the conduction band of the second n-side semiconductor layer 121 when the forward voltage is applied to the light-emitting element 10.

There is a tendency for the crystallinity of a semiconductor layer to easily degrade when the value of the In composition ratio the semiconductor layer is relatively high or when the n-type impurity concentration is relatively high. According to the embodiment, the fourth layer 121a has a higher n-type impurity and a larger value of the In composition ratio than the first layer 121b, but the thickness t4 of the fourth layer 121a is less than the thickness of the first layer 121b; therefore, the degradation of the crystallinity of the fourth layer 121a can be reduced.

On the other hand, by setting the first n-type impurity concentration of the first layer 121b to be less than the fourth n-type impurity concentration and by setting the thickness t1 of the first layer 121b to be greater than the thickness t4, the carrier density at the vicinity of the p-n junction portion formed by the first p-side semiconductor layer 114 and the second n-side semiconductor layer 121 can be increased while reducing the degradation of the crystallinity of the first layer 121b. Because the In included in the first layer 121b functions as a surfactant, the occurrence of point defects in the first layer 121b can be reduced. The diffusion of the p-type impurity included in the first p-side semiconductor layer 114 into the semiconductor layers positioned higher than the first layer 121b, such as the second layer 121c, the third layer 121d, the fifth layer 121e, etc., can be reduced thereby.

By forming the second layer 121c that includes Al on the first layer 121b, the point defects that occur when forming the semiconductor layers lower than the second layer 121c, such as the first layer 121b, the fourth layer 121a, etc., are filled, and the surface state of the second layer 121c can approach flat. By setting the second n-type impurity concentration of the second layer 121c to be not more than the first n-type impurity concentration, the degradation of the crystallinity due to the second layer 121c can be reduced while the first layer 121b ensures the carrier density at the vicinity of the p-n junction portion formed by the first p-side semiconductor layer 114 and the second n-side semiconductor layer 121.

Furthermore, the third layer 121d that is located higher than the second layer 121c has the thickness t3 that is greater than the thickness t1 and the third n-type impurity concentration that is less than the first n-type impurity concentration. The point defects that occur when forming the layers lower than the third layer 121d, such as the first layer 121b, the second layer 121c, the fourth layer 121a, etc., are further filled thereby, and the surface state of the third layer 121d can further approach flat. The degradation of the crystallinity of the semiconductor layers positioned higher than the third layer 121d, such as the fifth layer 121e, the second active layer 122, etc., can be reduced thereby. In particular, the luminous efficiency can be increased by reducing the degradation of the crystallinity of the second active layer 122.

However, the configuration of the second n-side semiconductor layer 121 is not limited to the configuration described above. For example, the second n-side semiconductor layer 121 may further include one or more undoped semiconductor layers. The undoped semiconductor layer of the second n-side semiconductor layer 121 includes, for example, GaN. Also, the second n-side semiconductor layer 121 may not include the fourth layer 121a.

The second active layer 122 has, for example, a multi-quantum well structure that includes multiple well layers and multiple barrier layers. The multiple well layers can include, for example, InGaN. The multiple barrier layers can include, for example, GaN. The well layer and the barrier layer may be, for example, undoped semiconductor layers. At least portions of the well layer and the barrier layer may include an n-type impurity and/or a p-type impurity. The second p-side semiconductor layer 123 is located on the second active layer 122.

The second p-side semiconductor layer 123 includes, for example, one or more p-type semiconductor layers. The p-type semiconductor layer of the second p-side semiconductor layer 123 includes, for example, GaN doped with Mg as the p-type impurity. The p-type semiconductor layer of the second p-side semiconductor layer 123 may further include Al.

It is sufficient for the second p-side semiconductor layer 123 to have a function of supplying holes to the second active layer 122, and the second p-side semiconductor layer 123 may further include one or more undoped semiconductor layers. The undoped semiconductor layer of the second p-side semiconductor layer 123 includes, for example, GaN. The undoped semiconductor layer of the second p-side semiconductor layer 123 may further include Al.

As shown in FIG. 1, the n-side electrode 13 is located on the first surface 112s1 of the first n-side semiconductor layer 112. The n-side electrode 13 is electrically connected to the first n-side semiconductor layer 112. The p-side electrode 14 is located on the second p-side semiconductor layer 123. The p-side electrode 14 is electrically connected to the second p-side semiconductor layer 123. The first active layer 113 and the second active layer 122 are caused to emit light by applying a forward voltage $V_f$ between the n-side electrode 13 and the p-side electrode 14.

The light that is emitted by the first and second active layers 113 and 122 is, for example, ultraviolet light or visible light. The light emission peak wavelength of the first active layer 113 and the light emission peak wavelength of the second active layer 122 can be the same. For example, the first active layer 113 and the second active layer 122 may emit blue light. The light emission peak wavelength of the first active layer 113 and the light emission peak wavelength of the second active layer 122 may be different. For example, the first active layer 113 may emit blue light, and the second active layer 122 may emit green light. The light emission peak wavelength of the blue light is, for example, not less than 430 nm and not more than 490 nm. The light emission peak wavelength of the green light is, for example, not less than 500 nm and not more than 540 nm. The light emission peak wavelength of the ultraviolet light is not more than 400 nm.

A reverse bias is applied between the second n-side semiconductor layer 121 and the first p-side semiconductor layer 114 when the forward voltage $V_f$ is applied between the n-side electrode 13 and the p-side electrode 14, that is, when a positive potential is applied to the p-side electrode 14 and a potential that is less than that of the p-side electrode 14 is applied to the n-side electrode 13. Therefore, a tunnel effect due to the tunnel junction of the second n-side semiconductor layer 121 with the first p-side semiconductor layer 114 is utilized to cause a current to flow between the second n-side semiconductor layer 121 and the first p-side semiconductor layer 114. Specifically, the current flows between the second n-side semiconductor layer 121 and the first p-side semiconductor layer 114 by electrons of the valence band of the first p-side semiconductor layer 114 tunneling to the conduction band of the second n-side semiconductor layer 121. In other words, the second n-side semiconductor layer 121 has a tunnel junction with the first p-side semiconductor layer 114 if a current flows between the second n-side semiconductor layer 121 and the first p-side semiconductor layer 114 when the forward voltage $V_f$ is applied to the light-emitting element 10.

By increasing the impurity concentrations of each conductivity type included in the p-type semiconductor layer and the n-type semiconductor layer forming the p-n junction of the first p-side semiconductor layer 114 and the second n-side semiconductor layer 121, the width of the depletion layer formed by the p-n junction can be reduced. When the voltage is applied, the electrons of the valence band of the first p-side semiconductor layer 114 tunnel into the conduction band of the second n-side semiconductor layer 121 more easily as the width of the depletion layer decreases.

A method for manufacturing the light-emitting element 10 will now be described.

Figure 4:
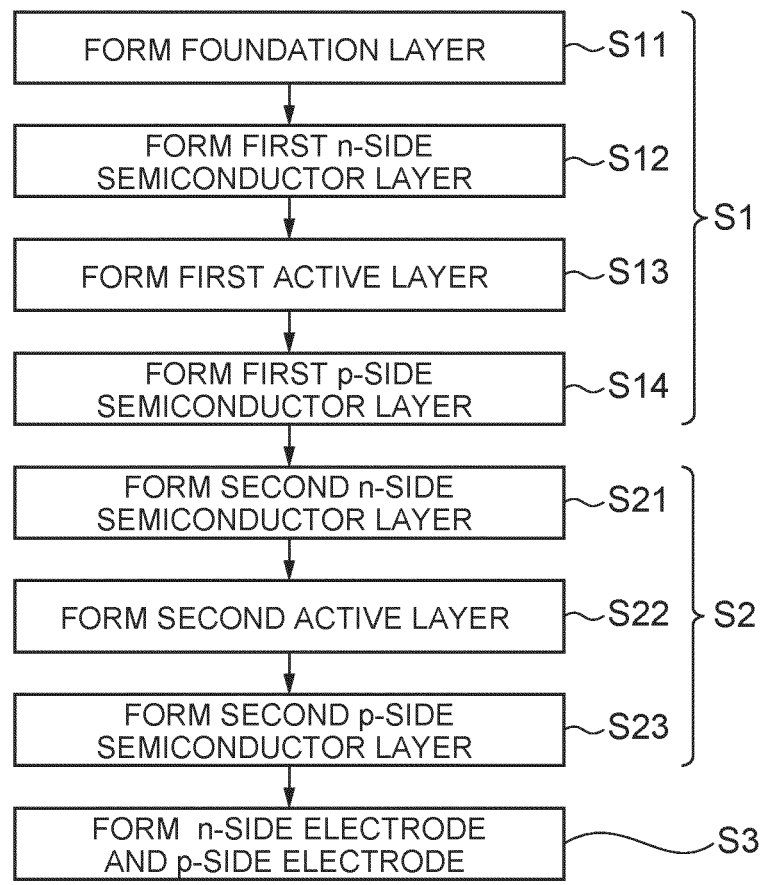
FIG. 4 is a flowchart showing the method for manufacturing the light-emitting element 10 according to the embodiment.

FIG. 4 is a flowchart showing the method for manufacturing the light-emitting element 10 according to the embodiment.

Figure 5:
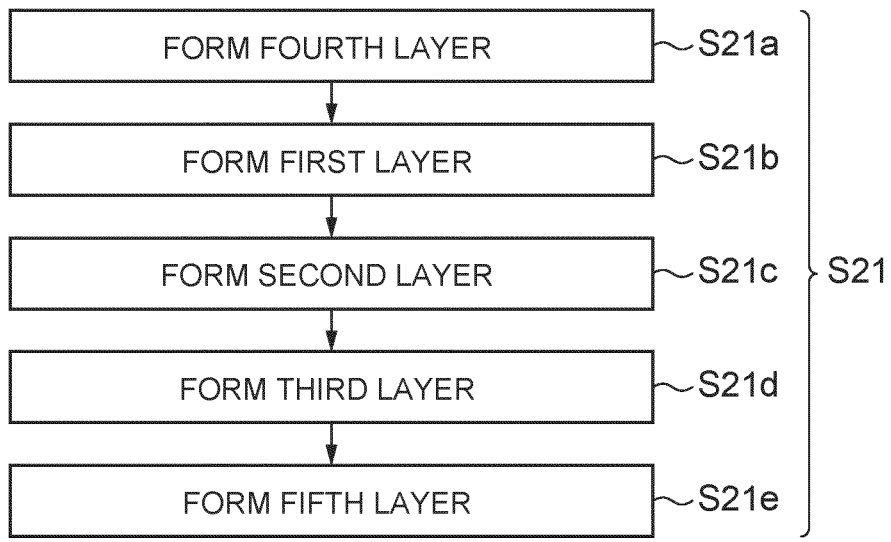
FIG. 5 is a flowchart showing details of a step S21 of forming the second n-side semiconductor layer 121.

FIG. 5 is a flowchart showing details of a step S21 of forming the second n-side semiconductor layer 121.

Figure 6:
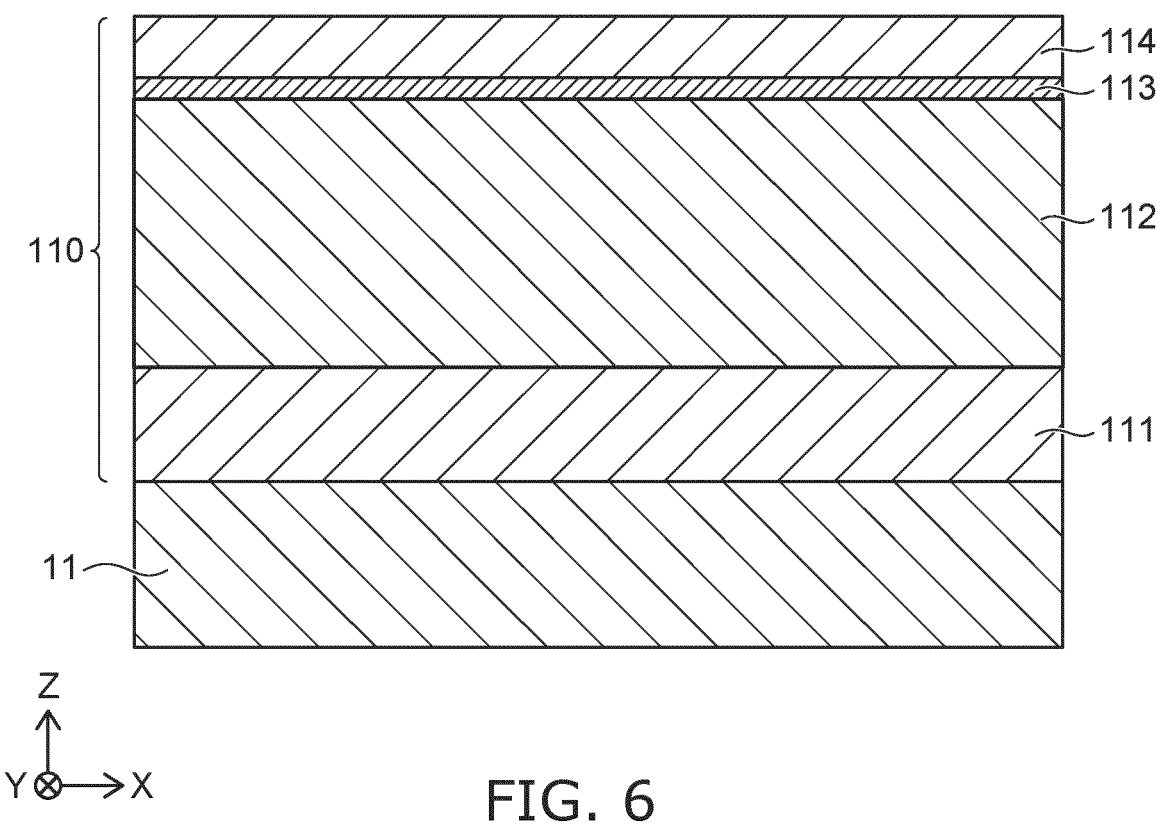
FIG. 6 is a cross-sectional view illustrating manufacturing processes of the light-emitting element 10 according to the embodiment.

FIG. 6 is a cross-sectional view illustrating manufacturing processes of the light-emitting element 10 according to the embodiment.

Figure 7:
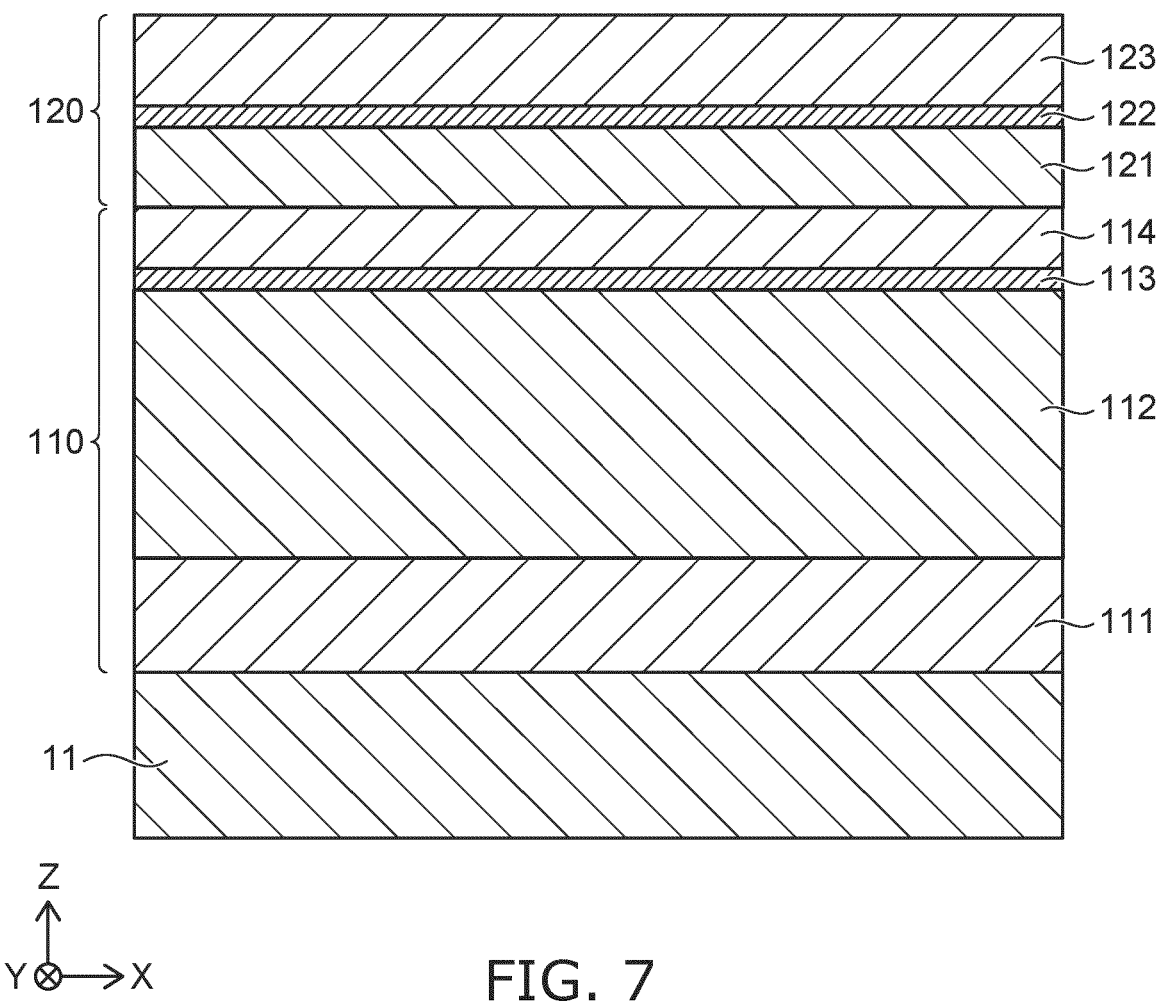
FIG. 7 is a cross-sectional view illustrating manufacturing processes of the light-emitting element 10 according to the embodiment.

FIG. 7 is a cross-sectional view illustrating manufacturing processes of the light-emitting element 10 according to the embodiment.

As shown in FIG. 4, the method for manufacturing the light-emitting element 10 includes a step S1 of forming the first light-emitting part 110, a step S2 of forming the second light-emitting part 120, and a step S3 of forming the n-side electrode 13 and the p-side electrode 14.

For example, the first light-emitting part 110 and the second light-emitting part 120 that are included in the semiconductor structure body 12 are formed by MOCVD (metal organic chemical vapor deposition) in a furnace in which the pressure and the temperature can be adjusted. Specifically, the semiconductor structure body 12 is formed on the substrate 11 by supplying a carrier gas and a raw material gas to the furnace.

For example, hydrogen ($H_2$) gas, nitrogen ($N_2$) gas, etc., can be used as the carrier gas.

The raw material gas is appropriately selected according to the semiconductor layer to be formed. When a semiconductor layer that includes Ga is formed, for example, a raw material gas that includes Ga, such as trimethylgallium (TMG) gas, triethylgallium (TEG) gas, or the like is used. When forming a semiconductor layer that includes N, for example, a raw material gas that includes N, such as ammonia ($NH_3$) gas or the like is used. When forming a semiconductor layer that includes Al, for example, a raw material gas that includes Al, such as trimethylaluminum (TMA) gas or the like is used. When forming a semiconductor layer that includes In, for example, a raw material gas that includes In, such as trimethylindium (TMI) or the like is used. When forming a semiconductor layer that includes Si, for example, a gas that includes Si, such as monosilane ($SiH_4$) gas or the like is used. When forming a semiconductor layer that includes Mg, for example, a raw material gas that includes Mg, such as bis cyclopentadienyl magnesium ($Cp_2Mg$) gas or the like is used. Hereinbelow, the supply of a raw material gas that includes one element and a raw material gas that includes another element to the furnace also is called simply "supplying a raw material gas that includes one element and another element." The processes will now be elaborated.

First, the step S1 of forming the first light-emitting part 110 is performed.

The step S1 of forming the first light-emitting part 110 includes a step S11 of forming the foundation layer 111, a step S12 of forming the first n-side semiconductor layer 112, a step S13 of forming the first active layer 113, and a step S14 of forming the first p-side semiconductor layer 114.

In the step S11 of forming the foundation layer 111, a carrier gas and a raw material gas that correspond to the foundation layer 111 are supplied to the furnace. Thereby, the foundation layer 111 is formed on the substrate 11.

In the step S12 of forming the first n-side semiconductor layer 112, a carrier gas and a raw material gas that correspond to the first n-side semiconductor layer 112 are supplied to the furnace. Thereby, the first n-side semiconductor layer 112 is formed on the foundation layer 111.

The step S13 of forming the first active layer 113 supplies a carrier gas and a raw material gas corresponding to the first active layer 113 to the furnace. Thereby, the first active layer 113 is formed on the first n-side semiconductor layer 112.

In the step S14 of forming the first p-side semiconductor layer 114, a carrier gas and a raw material gas that correspond to the first p-side semiconductor layer 114 are supplied to the furnace. Thereby, the first p-side semiconductor layer 114 is formed on the first active layer 113.

Thus, as shown in FIG. 6, the first light-emitting part 110 that includes the foundation layer 111, the first n-side semiconductor layer 112, the first active layer 113, and the first p-side semiconductor layer 114 is formed on the substrate 11.

Then, the step S2 of forming the second light-emitting part 120 is performed.

As shown in FIG. 4, the step S2 of forming the second light-emitting part 120 includes the step S21 of forming the second n-side semiconductor layer 121, a step S22 of forming the second active layer 122, and a step S23 of forming the second p-side semiconductor layer 123.

According to the embodiment as shown in FIG. 5, the step S21 of forming the second n-side semiconductor layer 121 includes a step S21a of forming the fourth layer 121a, a step S21b of forming the first layer 121b, a step S21c of forming the second layer 121c, a step S21d of forming the third layer 121d, and a step S21e of forming the fifth layer 121e.

In the step S21a of forming the fourth layer 121a, a carrier gas, a raw material gas that includes In, Ga, and N, and a raw material gas that includes Si as an n-type impurity are supplied. Thereby, the fourth layer 121a that is made of an InGaN layer doped with Si is formed on the first p-side semiconductor layer 114.

In the step S21b of forming the first layer 121b, a carrier gas, a raw material gas that includes Ga and N, and a raw material gas that includes Si as an n-type impurity are supplied. Thereby, the first layer 121b that is made of a GaN layer doped with Si is formed on the fourth layer 121a. At this time, the flow rates of the raw material gas including Ga, the raw material gas including N, and the raw material gas including Si are adjusted so that the first n-type impurity concentration is less than the fourth n-type impurity concentration.

Also, the thickness t1 of the first layer 121b is formed to be less than 50% of the thickness t3 of the third layer 121d. At this time, a raw material gas that includes In also may be supplied. For example, the thicknesses of the semiconductor layers can be adjusted by appropriately modifying the formation times of the semiconductor layers.

In the step S21c of forming the second layer 121c, a carrier gas, a raw material gas that includes Al, Ga, and N, and a raw material gas that includes Si as an n-type impurity are supplied. Thereby, the second layer 121c that is made of an AlGaN layer doped with Si is formed on the first layer 121b. At this time, the flow rates of the raw material gas including Al, the raw material gas including Ga, the raw material gas including N, and the raw material gas including Si are adjusted so that the second n-type impurity concentration is not more than the first n-type impurity concentration. However, as described above, the second n-type impurity concentration may be greater than the first n-type impurity concentration. Also, the thickness t2 of the second layer 121c is formed to be less than 50% of the thickness t3 of the third layer 121d.

In the step S21d of forming the third layer 121d, a carrier gas, a raw material gas that includes Ga and N, and a raw material gas that includes Si as an n-type impurity are supplied. Thereby, the third layer 121d that is made of a GaN layer doped with Si is formed on the second layer 121c. At this time, the flow rates of the raw material gas including Ga, the raw material gas including N, and the raw material gas including Si are adjusted so that the third n-type impurity concentration is less than the second n-type impurity concentration. Also, the thickness t3 of the third layer 121d is formed to be greater than the thickness t1 of the first layer 121b.

In the step S21e of forming the fifth layer 121e, a GaN layer that is doped with Si as an n-type impurity and an InGaN layer that is doped with Si as an n-type impurity are alternately formed on the third layer 121d. The GaN layer that is doped with Si is formed by supplying a carrier gas, a raw material gas that includes Ga and N, and a raw material gas that includes Si to the furnace. The InGaN layer that is doped with Si is formed by supplying a carrier gas, a raw material gas that includes In, Ga, and N, and a raw material gas that includes Si to the furnace.

The step S22 of forming the second active layer 122 supplies a carrier gas and a raw material gas that correspond to the second active layer 122 to the furnace. Thereby, the second active layer 122 is formed on the second n-side semiconductor layer 121.

In the step S23 of forming the second p-side semiconductor layer 123, a carrier gas and a raw material gas that correspond to the second p-side semiconductor layer 123 are supplied to the furnace. Thereby, the second p-side semiconductor layer 123 is formed on the second active layer 122.

Thus, as shown in FIG. 7, the second light-emitting part 120 that includes the second n-side semiconductor layer 121, the second active layer 122, and the second p-side semiconductor layer 123 is formed on the first light-emitting part 110.

Then, the step S3 of forming the n-side electrode 13 and the p-side electrode 14 is performed.

In the step S3 of forming the n-side electrode 13 and the p-side electrode 14, first, the first and third surfaces 112s1 and 112s3 of the first n-side semiconductor layer 112 are exposed at the first active layer 113, the first p-side semiconductor layer 114, and the second light-emitting part 120 by removing a portion of the semiconductor structure body 12 as shown in FIG. 1. For example, the portion of the semiconductor structure body 12 can be removed by selectively etching by using a resist.

Then, the n-side electrode 13 is formed on the exposed first surface 112s1. The p-side electrode 14 is formed on the second p-side semiconductor layer 123. For example, the n-side electrode 13 and the p-side electrode 14 can be formed by sputtering or vapor deposition.

Thus, the light-emitting element 10 can be obtained. However, the method for manufacturing the light-emitting element 10 is not limited to the method described above. For example, the method for manufacturing the light-emitting element 10 may not include the step S11 of forming the foundation layer 111, and the first n-side semiconductor layer 112 may be directly formed on the substrate 11.

Effects of the embodiment will now be described.

The light-emitting element 10 according to the embodiment includes the first n-side semiconductor layer 112, the first active layer 113, the first p-side semiconductor layer 114, the second n-side semiconductor layer 121 contacting the first p-side semiconductor layer 114, the second active layer 122, and the second p-side semiconductor layer 123 that are made of nitride semiconductors successively from a lower side to an upper side. The second n-side semiconductor layer 121 includes, successively from a lower side to an upper side, the first layer 121b that includes Ga, the second layer 121c that includes Al and Ga, and the third layer 121d that includes Ga and has a lower n-type impurity concentration than the first and second layers 121b and 121c. The thickness t1 of the first layer 121b and the thickness t2 of the second layer 121c each are less than 50% of the thickness t3 of the third layer 121d.

According to the light-emitting element 10 described above, the carrier concentration of the vicinity of the p-n junction portion formed by the first p-side semiconductor layer 114 and the second n-side semiconductor layer 121 can be increased by the first layer 121b having a higher n-type impurity concentration than the third layer 121d. The second layer 121c that includes Al fills the point defects occurring when forming the semiconductor layers lower than the second layer 121c, such as the first layer 121b, etc., and the surface state of the second layer 121c can approach flat. The point defects are further filled by the third layer 121d that has a lower n-type impurity concentration than the first and second layers 121b and 121c, and the surface state of the third layer 121d can approach flat even more. The degradation of the crystallinity can be reduced by setting the thicknesses of the first and second layers 121b and 121c that have higher n-type impurity concentrations than the third layer 121d to be less than the thickness t3 of the third layer 121d. Thus, the degradation of the crystallinity of the second active layer 122 formed on the second n-side semiconductor layer 121 can be reduced. The luminous efficiency of the light-emitting element 10 can be increased thereby.

The thickness t2 of the second layer 121c is less than the thickness t1 of the first layer 121b. Therefore, the crystallinity can be improved by the second layer 121c while reducing the degradation of the forward voltage $V_f$ due to an increase of the thickness t2 of the second layer 121c.

The thickness t2 of the second layer 121c is not more than 40% of the total thickness t12 of the first and second layers 121b and 121c. Therefore, the crystallinity can be improved by the second layer 121c while reducing the degradation of the crystallinity of the first layer 121b.

The n-type impurity concentration of the second layer 121c is not more than the n-type impurity concentration of the first layer 121b. Therefore, the crystallinity can be improved by the second layer 121c while the first layer 121b ensures the carrier density at the vicinity of the p-n junction portion formed by the first p-side semiconductor layer 114 and the second n-side semiconductor layer 121.

The first layer 121b may further include In. In such a case, the surface state of the first layer 121b can approach flat because the In included in the first layer 121b functions as a surfactant.

The second n-side semiconductor layer 121 further includes the fourth layer 121a located between the first layer 121b and the first p-side semiconductor layer 114. The fourth layer 121a includes In and Ga and has a higher n-type impurity concentration than the first and second layers 121b and 121c. According to such a fourth layer 121a, the carrier density at the vicinity of the p-n junction portion formed by the first p-side semiconductor layer 114 and the second n-side semiconductor layer 121 can be increased. Because the bandgap of the fourth layer 121a can be reduced, the tunnel effect easily occurs between the first p-side semiconductor layer 114 and the second n-side semiconductor layer 121.

EXAMPLES

Examples and reference examples will now be described.

Figure 8A:
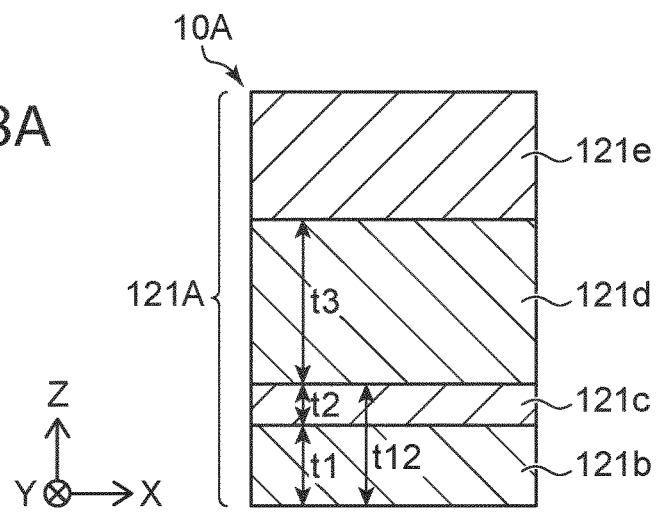
FIG. 8A is a cross-sectional view showing the layer configuration of a second n-side semiconductor layer 121A of a light-emitting element 10A according to examples 1 to 4.

FIG. 8A is a cross-sectional view showing the layer configuration of a second n-side semiconductor layer 121A of a light-emitting element 10A according to the examples 1 to 4.

Figure 8B:
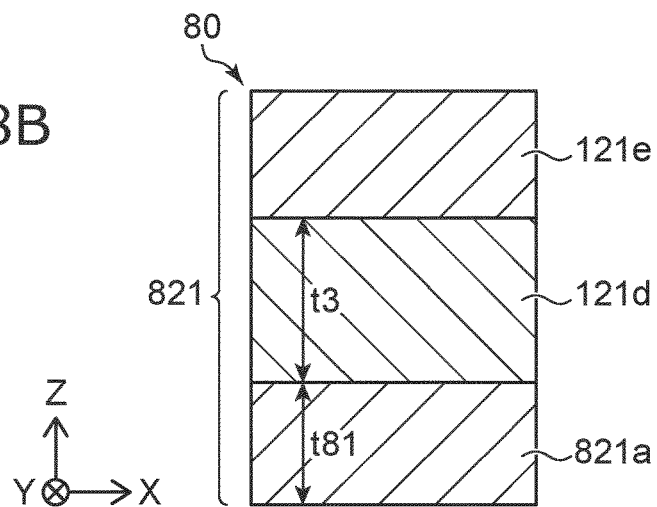
FIG. 8B is a cross-sectional view showing the layer configuration of a second n-side semiconductor layer 821 of a light-emitting element 80 according to a reference example 1.

FIG. 8B is a cross-sectional view showing the layer configuration of a second n-side semiconductor layer 821 of a light-emitting element 80 according to a reference example 1.

Figure 8C:
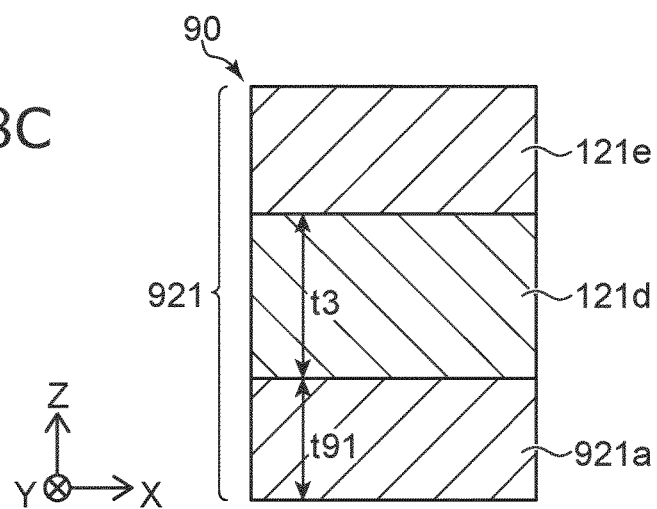
FIG. 8C is a cross-sectional view showing the layer configuration of a second n-side semiconductor layer 921 of a light-emitting element 90 according to a reference example 2.

FIG. 8C is a cross-sectional view showing the layer configuration of a second n-side semiconductor layer 921 of a light-emitting element 90 according to a reference example 2.

FIG. 8A shows the layer configuration, and the actual magnitude relationship of the thicknesses of the layers may be different.

The light-emitting element 10A according to the examples 1 to 4 differed from the light-emitting element 10 according to the embodiment described above in that the second n-side semiconductor layer 121A was made of the first layer 121b, the second layer 121c, the third layer 121d, and the fifth layer 121e and did not include the fourth layer 121a; otherwise, the layer configuration was similar to that of the light-emitting element 10 according to the embodiment. The light-emitting element 10A according to the examples 1 to 4 was made to have the thickness t1 of the first layer 121b and the thickness t2 of the second layer 121c shown in the following table.

Then, the first p-side semiconductor layer 114 that included a GaN layer doped with Mg and had a thickness of about 15 nm was formed on the first active layer 113.

Continuing, on the first p-side semiconductor layer 114, the second n-side semiconductor layer 821 was formed in the reference example 1, the second n-side semiconductor layer 921 was formed in the reference example 2, and the second n-side semiconductor layer 121A was formed in the examples 1 to 4.

The second n-side semiconductor layer 821 of the reference example 1 included the lowermost layer 821a, the third layer 121d, and the fifth layer 121e successively from a lower side to an upper side. The lowermost layer 821a was made of a GaN layer doped with Si, and a thickness t81 of the lowermost layer 821a was about 35 nm. The third layer 121d was made of a GaN layer doped with Si, and the thickness t3 of the third layer 121d was about 100 nm. The third n-type impurity concentration of the third layer 121d was less than the n-type impurity concentration of the lowermost layer 821a. The n-type impurity concentration of the lowermost layer 821a was equal to the n-type impurity concentration of the first layer 121b. The fifth layer 121e included a stacked body in which a GaN layer doped with Si

TABLE 1

|  | Example 1 | Example 2 | Example 3 | Example 4 | Reference example 1 | Reference example 2 |
|---|---|---|---|---|---|---|
| First layer thickness | 15 nm | 17.5 nm | 20 nm | 25 nm | 35 nm (Lowermost layer) | 35 nm (Lowermost layer) |
| Second layer thickness | 20 nm | 17.5 nm | 15 nm | 10 nm | | |
| Third layer thickness | 100 nm | 100 nm | 100 nm | 100 nm | 100 nm | 100 nm |

The light-emitting element 80 according to the reference example 1 differed from the light-emitting element 10A according to the examples 1 to 4 in that the first layer 121b and the second layer 121c were replaced with a GaN layer doped with Si (hereinbelow, called a "lowermost layer 821a"); otherwise, the layer configuration was made to be common with the light-emitting element 10A according to the examples 1 to 4.

The light-emitting element 90 according to the reference example 2 differed from the light-emitting element 10A according to the examples 1 to 4 in that the first layer 121b and the second layer 121c were replaced with an AlGaN layer doped with Si (hereinbelow, called a "lowermost layer 921a"); otherwise, the layer configuration was made to be common with the light-emitting element 10A according to the examples 1 to 4. The method for manufacturing the light-emitting elements 10A, 80, and 90 will now be elaborated.

First, the foundation layer 111 that included an undoped GaN layer and had a thickness of about 5 μm was formed on the substrate 11 made of sapphire.

Then, the first n-side semiconductor layer 112 that had a thickness of about 5.5 μm and included an undoped GaN layer and a GaN layer doped with Si was formed on the foundation layer 111.

Continuing, the first active layer 113 that had a thickness of about 50 nm and included multiple barrier layers including undoped GaN layers and multiple well layers including undoped InGaN layers was formed on the first n-side semiconductor layer 112. The first active layer 113 was formed to include seven pairs of the barrier layer and the well layer.

and an InGaN layer doped with Si were alternately stacked, and had a thickness of about 56 nm.

The second n-side semiconductor layer 921 of the reference example 2 included the lowermost layer 921a, the third layer 121d, and the fifth layer 121e successively from a lower side to an upper side. The lowermost layer 921a was made of an AlGaN layer doped with Si, and a thickness t91 of the lowermost layer 921a was about 35 nm. The value of the Al composition ratio of the lowermost layer 921a was about 13%. The n-type impurity concentration of the lowermost layer 921a was substantially equal to the n-type impurity concentration of the lowermost layer 821a. The n-type impurity concentration of the lowermost layer 921a was equal to the n-type impurity concentration of the second layer 121c. The third layer 121d of the reference example 2 was formed similarly to the third layer 121d of the reference example 1, and the fifth layer 121e of the reference example 2 was formed similarly to the fifth layer 121e of the reference example 1.

The second n-side semiconductor layer 121A of the examples 1 to 4 included the first layer 121b, the second layer 121c, the third layer 121d, and the fifth layer 121e successively from a lower side to an upper side.

The first layer 121b was made of a GaN layer doped with Si. The thickness t1 of the first layer 121b in the example 1 was 15 nm, the thickness t1 of the first layer 121b in the example 2 was 17.5 nm, the thickness t1 of the first layer 121b in the example 3 was 20 nm, and the thickness t1 of the first layer 121b in the example 4 was 25 nm.

The second layer 121c was made of an AlGaN layer doped with Si. The value of the Al composition ratio of the second layer 121c was about 13%. The second n-type impurity concentration of the second layer 121c was less than the first n-type impurity concentration of the first layer 121b. The thickness t2 of the second layer 121c in the example 1 was 20 nm, the thickness t2 of the second layer 121c in the example 2 was 17.5 nm, the thickness t2 of the second layer 121c in the example 3 was 15 nm, and the thickness t2 of the second layer 121c in the example 4 was 10 nm. The third layer 121d of the examples 1 to 4 was formed similarly to the third layer 121d of the reference example 1, and the fifth layer 121e of the examples 1 to 4 was formed similarly to the fifth layer 121e of the reference example 1.

Then, the second active layer 122 that had a thickness of about 50 nm and included multiple barrier layers including undoped GaN layers and multiple well layers including undoped InGaN layers was formed on the second n-side semiconductor layers 121A, 821, and 921. The second active layer 122 was formed to include seven pairs of the barrier layer and the well layer.

Continuing, the second p-side semiconductor layer 123 that included a GaN layer doped with Mg and had a thickness of about 11 nm was formed on the second active layer 122.

Then, portions of the first n-side semiconductor layer 112, the first active layer 113, the first p-side semiconductor layer 114, the second n-side semiconductor layers 121A, 821, and 921, the second active layer 122, and the second p-side semiconductor layer 123 were removed, the n-side electrode 13 was formed on the exposed first n-side semiconductor layer 112, and the p-side electrode 14 was formed on the second p-side semiconductor layer.

Figure 9A:
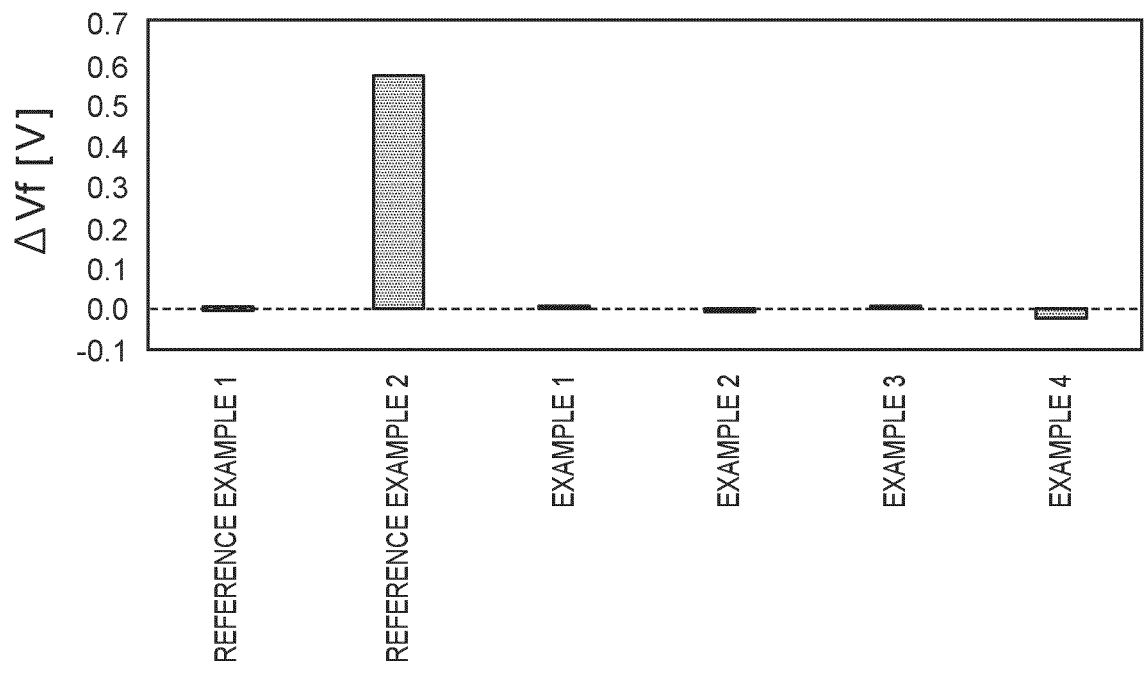
FIG. 9A is a graph showing a difference $\Delta V_f$ between the forward voltage $V_f$ and the forward voltage $V_{fref}$ used as the reference for the light-emitting element 80 according to the reference example 1, the light-emitting element 90 according to the reference example 2, and the light-emitting element 10A according to the examples.

FIG. 9A is a graph showing a difference $\Delta V_f$ between the forward voltage $V_f$ and the forward voltage $V_{fref}$ used as the reference for the light-emitting element 80 according to the reference example 1, the light-emitting element 90 according to the reference example 2, and the light-emitting element 10A according to the examples.

Figure 9B:
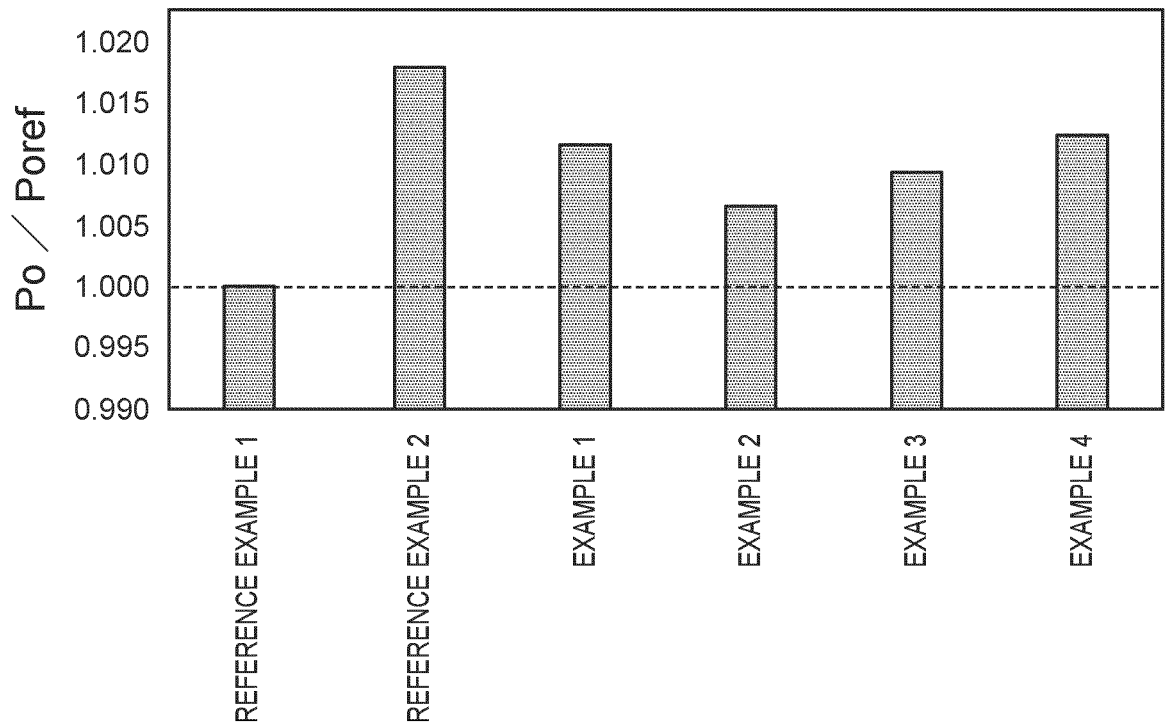
FIG. 9B is a graph showing the values $P_o/P_{oref}$ of the normalized outputs $P_o$ of the light-emitting element 80 according to the reference example 1, the light-emitting element 90 according to the reference example 2, and the light-emitting element 10A according to the examples.

FIG. 9B is a graph showing the values $P_o/P_{oref}$ of the normalized outputs $P_o$ of the light-emitting element 80 according to the reference example 1, the light-emitting element 90 according to the reference example 2, and the light-emitting element 10A according to the examples.

The forward voltages $V_f$ were measured for the light-emitting element 80 according to the reference example 1, the light-emitting element 90 according to the reference example 2, and the light-emitting element 10A according to the examples 1 to 4 that were made. The results are shown in FIG. 9A. The forward voltage $V_f$ of the reference example 1 was used as the reference forward voltage $V_{fref}$, and the vertical axis of FIG. 9A is the values of the reference forward voltage $V_{fref}$ subtracted from the measured forward voltages $V_f$. In other words, $\Delta V_f = V_f - V_{fref}$.

The outputs $P_o$ were measured for the light-emitting element 80 according to the reference example 1, the light-emitting element 90 according to the reference example 2, and the light-emitting element 10A according to the examples 1 to 4 that were made. The results are shown in FIG. 9B. The output $P_o$ of the reference example 1 was used as the reference output $P_{oref}$, and the vertical axis of FIG. 9B is the values of the measured outputs $P_o$ normalized by dividing by the reference output $P_{oref}$.

The light-emitting element 90 according to the reference example 2 differed from the light-emitting element 80 according to the reference example 1 in that the lowermost layer 921a was an AlGaN layer instead of a GaN layer. Although the output $P_o$ of the light-emitting element 90 according to the reference example 2 was greater than the output $P_o$ of the light-emitting element 80 according to the reference example 1 as shown in FIG. 9B, the forward voltage $V_f$ of the light-emitting element 90 according to the reference example 2 was greater than the forward voltage $V_f$ of the light-emitting element 80 according to the reference example 1 as shown in FIG. 9A. Accordingly, it was found that when simply replacing the GaN layer with an AlGaN layer, the output $P_o$ can be increased, but the forward voltage $V_f$ is undesirably increased.

The light-emitting element 10A according to the examples 1 to 4 differed from the light-emitting element 90 according to the reference example 2 in that the first layer 121b made of the GaN layer and the second layer 121c that was made of an AlGaN layer and located on the first layer 121b were included instead of the lowermost layer 921a made of an AlGaN layer. According to the examples 1 to 4, the thickness t1 of the first layer 121b and the thickness t2 of the second layer 121c each were less than 50% of the thickness of the third layer 121d. As shown in FIG. 9B, the outputs $P_o$ of the light-emitting element 10A according to the examples 1 to 4 were less than the output $P_o$ of the light-emitting element 90 according to the reference example 2 but greater than the output $P_o$ of the light-emitting element 80 according to the reference example 1. As shown in FIG. 9A, the forward voltages $V_f$ of the light-emitting element 10A according to the examples 1 to 4 were less than the forward voltage $V_f$ of the light-emitting element 90 according to the reference example 2 but equal to the forward voltage $V_f$ of the light-emitting element 80 according to the reference example 1. In other words, the high forward voltage $V_f$ was reduced to a value about equal to the forward voltage $V_f$ of the reference example 1 by replacing the lower part of the lowermost layer 921a with a GaN layer (the first layer 121b) and by setting the thickness t1 of the first layer 121b and the thickness t2 of the second layer 121c each to be less than 50% of the thickness of the third layer 121d. Accordingly, it is favorable for the second n-side semiconductor layer 121 to include both the first and second layers 121b and 121c and for the thickness t1 of the first layer 121b and the thickness t2 of the second layer 121c each to be less than 50% of the thickness of the third layer 121d.

In particular, among the light-emitting elements 10A according to the examples 1 to 4, the forward voltage $V_f$ was a minimum and the output $P_o$ was a maximum in the light-emitting element 10A according to the example 4. The thickness t2 of the second layer 121c was less than the thickness t1 of the first layer 121b in the light-emitting element 10A according to the example 4. More specifically, in the light-emitting element 10A according to the example 4, the thickness t2 (10 nm) of the second layer 121c was not more than 40% of the total thickness t12 (35 nm) of the first and second layers 121b and 121c. Accordingly, it is favorable for the thickness t2 of the second layer 121c to be less than the thickness t1 of the first layer 121b. It is favorable for the thickness t2 of the second layer 121c to be not more than 40% of the total thickness t12 of the first and second layers 121b and 121c.

According to embodiments described above, a light-emitting element that has high luminous efficiency can be provided.

What is claimed is:

1. A light-emitting element, comprising:
successively from a lower side to an upper side, a first n-side semiconductor layer, a first active layer, a first p-side semiconductor layer, a second n-side semiconductor layer, a second active layer, and a second p-side semiconductor layer, each of which is made of a nitride semiconductor; wherein:

the second n-side semiconductor layer contacts the first p-side semiconductor layer;

the second n-side semiconductor layer comprises, successively from a lower side to an upper side:
- a first layer comprising gallium and having a first n-type impurity concentration,
- a second layer comprising aluminum and gallium and having a second n-type impurity concentration, and
- a third layer comprising gallium and having a third n-type impurity concentration lower than the first n-type impurity concentration and the second n-type impurity concentration; and a thickness of the first layer and a thickness of the second layer are each less than 50% of a thickness of the third layer.

2. The element according to claim 1, wherein:
the thickness of the second layer is less than the thickness of the first layer.

3. The element according to claim 1, wherein:
the thickness of the second layer is not more than 40% of a total thickness of the first and second layers.

4. The element according to claim 2, wherein:
the thickness of the second layer is not more than 40% of a total thickness of the first and second layers.

5. The element according to claim 1, wherein:
the second n-type impurity concentration is not more than the first n-type impurity concentration.

6. The element according to claim 2, wherein:
the second n-type impurity concentration is not more than the first n-type impurity concentration.

7. The element according to claim 3, wherein:
the second n-type impurity concentration is not more than the first n-type impurity concentration.

8. The element according to claim 1, wherein:
a value of a composition ratio of aluminum of the second layer is not less than 5% and not more than 35%.

9. The element according to claim 2, wherein:
a value of a composition ratio of aluminum of the second layer is not less than 5% and not more than 35%.

10. The element according to claim 3, wherein:
a value of a composition ratio of aluminum of the second layer is not less than 5% and not more than 35%.

11. The element according to claim 1, wherein:
the first layer further comprises indium.

12. The element according to claim 2, wherein:
the first layer further comprises indium.

13. The element according to claim 1, wherein:
the second n-side semiconductor layer further comprises a fourth layer located between the first layer and the first p-side semiconductor layer; and
the fourth layer comprises indium and gallium and has a fourth n-type impurity concentration higher than the first n-type impurity concentration and the second n-type impurity concentration.

14. The element according to claim 2, wherein:
the second n-side semiconductor layer further comprises a fourth layer located between the first layer and the first p-side semiconductor layer; and
the fourth layer comprises indium and gallium and has a fourth n-type impurity concentration higher than the first n-type impurity concentration and the second n-type impurity concentration.

15. The element according to claim 1, wherein:
the thickness of the first layer is not less than 10 nm and not more than 40 nm.

16. The element according to claim 2, wherein:
the thickness of the first layer is not less than 10 nm and not more than 40 nm.

17. The element according to claim 1, wherein:
the thickness of the second layer is not less than 10 nm and not more than 30 nm.

18. The element according to claim 15, wherein:
the thickness of the second layer is not less than 10 nm and not more than 30 nm.

19. The element according to claim 1, wherein:
the thickness of the third layer is not less than 80 nm and not more than 150 nm.

20. The element according to claim 1, wherein:
the thickness of the third layer is not less than 80 nm and not more than 150 nm.

21. The element according to claim 18, wherein:
the thickness of the third layer is not less than 80 nm and not more than 150 nm.

22. The element according to claim 1, wherein:
the first layer and the third layer are gallium nitride layers doped with an n-type impurity; and
the second layer is an aluminum gallium nitride layer doped with an n-type impurity.

* * * * *